(12) United States Patent
Blomquist

(10) Patent No.: US 8,040,693 B2
(45) Date of Patent: Oct. 18, 2011

(54) UNIVERSAL EXPANDABLE PATCH PANEL BRACKET

(75) Inventor: Edward G. Blomquist, Plainfield, IL (US)

(73) Assignee: Panduit Corp., Tinley Park, IL (US)

( * ) Notice: Subject to any disclaimer, the term of this patent is extended or adjusted under 35 U.S.C. 154(b) by 588 days.

(21) Appl. No.: 12/244,484

(22) Filed: Oct. 2, 2008

(65) Prior Publication Data

US 2010/0085726 A1    Apr. 8, 2010

(51) Int. Cl.
    *H02B 1/20*    (2006.01)
(52) U.S. Cl. ......... 361/826; 361/752; 174/481; 248/201
(58) Field of Classification Search ............... 361/823, 361/826, 827, 752; 312/223.2, 265.4; 174/101, 174/50, 135, 481, 68.3, 99 E, 72 A; 385/134, 385/135; 211/26, 175; 248/201, 298.1; 439/540.1, 439/532
    See application file for complete search history.

(56) References Cited

U.S. PATENT DOCUMENTS

| | | |
|---|---|---|
| 3,156,765 A | 11/1964 | Weiss |
| 4,497,411 A | 2/1985 | DeBortoli |
| 4,712,232 A | 12/1987 | Rodgers |
| 5,115,377 A | 5/1992 | Dransman |
| 5,548,489 A | 8/1996 | Reed et al. |
| 5,647,763 A | 7/1997 | Arnold et al. |
| 6,079,677 A | 6/2000 | Daoud |
| 6,102,214 A | 8/2000 | Mendoza |
| 6,318,680 B1 | 11/2001 | Benedict et al. |
| 6,347,714 B1 | 2/2002 | Fournier et al. |
| 6,489,565 B1 | 12/2002 | Krietzman et al. |
| 6,501,899 B1 | 12/2002 | Marrs et al. |
| 6,605,782 B1 | 8/2003 | Krietzman et al. |
| 6,666,340 B2 | 12/2003 | Basinger et al. |
| 6,945,504 B2 | 9/2005 | Chen et al. |
| 7,087,840 B2 | 8/2006 | Herring et al. |
| 7,119,282 B2 | 10/2006 | Krietzman et al. |
| 7,406,240 B2 | 7/2008 | Murano |
| 7,687,716 B2 * | 3/2010 | Pepe et al. .................. 174/101 |
| 2007/0041693 A1 | 2/2007 | Farrell et al. |
| 2007/0099493 A1 | 5/2007 | Niazi |
| 2007/0099494 A1 | 5/2007 | Niazi et al. |
| 2008/0023212 A1 * | 1/2008 | Larsen et al. .................. 174/101 |
| 2010/0264788 A1 * | 10/2010 | Adducci et al. ............. 312/223.2 |

OTHER PUBLICATIONS

Mounting Bracket, ICC, catalog p. B-7 (undated).
Net-Access TM Server Cabinet, Panduit Corp., (http://www.panduit.com/search/product_details.asp?view=print&keywords=+cvp&srchRed=true) (Nov. 21, 2007).
Vertigo TM Zero-U Patch Panel, Leviton Manufacturing Co., Inc., 2 catalog pages (2006).

* cited by examiner

*Primary Examiner* — Hung Duong
(74) *Attorney, Agent, or Firm* — Robert A. McCann; Christopher S. Clancy; Aimee E. McVady

(57) ABSTRACT

The present invention is directed toward a device that vertically mounts a patch panel to a server cabinet. The device includes a main bracket, a lower mount bracket and rail mount brackets. The main bracket includes an upper end and a lower end. The lower mount bracket is adjustably secured to the lower end of the main bracket. One of the rail mount brackets is adjustably secured to the upper end of the main bracket and a second rail mount bracket is adjustably secured to a lower end of the lower mount bracket. The rail mount brackets secure the device to the server cabinet.

17 Claims, 14 Drawing Sheets

UNIVERSAL EXPANDABLE PATCH PANEL BRACKET

FIELD OF THE INVENTION

The present invention relates to a patch panel bracket, and more particularly to a patch panel bracket expandable in a horizontal and a vertical direction.

BACKGROUND OF THE INVENTION

Patch panels are typically horizontally mounted in server cabinets. The patch panels, however, occupy valuable rack unit space between the cabinet rails. Thus, it is desirable to mount a flat patch panel vertically along the side of standard server cabinets used in data centers. Data centers generally include server cabinets that are 24 inches wide, however, there are no specific cabinet dimension standards that cabinet manufactures must follow. Thus, the distance between the rear mounting rails and the rear doors and between the rear mounting rails and the side panels of the server cabinets may vary from cabinet to cabinet.

As a result, there is a need for an expandable mounting bracket that is capable of vertically mounting a patch panel to various server cabinets.

SUMMARY OF THE INVENTION

The present invention is directed to an expandable bracket that vertically mounts a patch panel in a server cabinet. The expandable patch panel bracket includes a main bracket, a lower mount bracket and rail mount brackets. The main bracket includes an upper end, a lower end and front members. The lower mount bracket is adjustably secured to the lower end of the main bracket. A first rail mount bracket is adjustably secured to the upper end of the main bracket and a second rail mount bracket is adjustably secured to the lower end of the lower mount bracket. The rail mount brackets secure the expandable bracket to the rails in the server cabinet.

DETAILED DESCRIPTION

Figure 1:
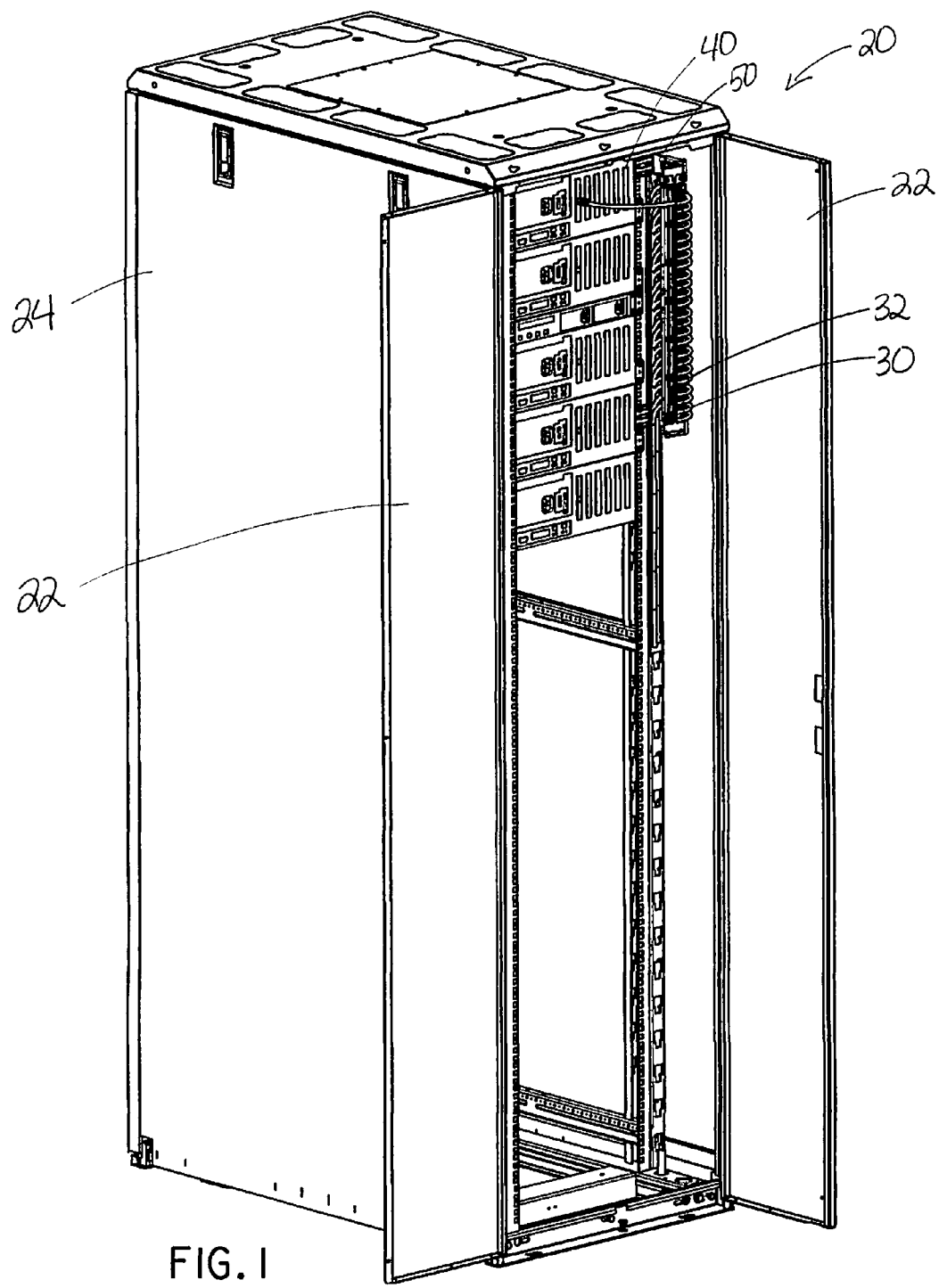
FIG. 1 is a perspective view of a patch panel vertically mounted in a cabinet to the expandable patch panel bracket of the present invention.
Figure 2:
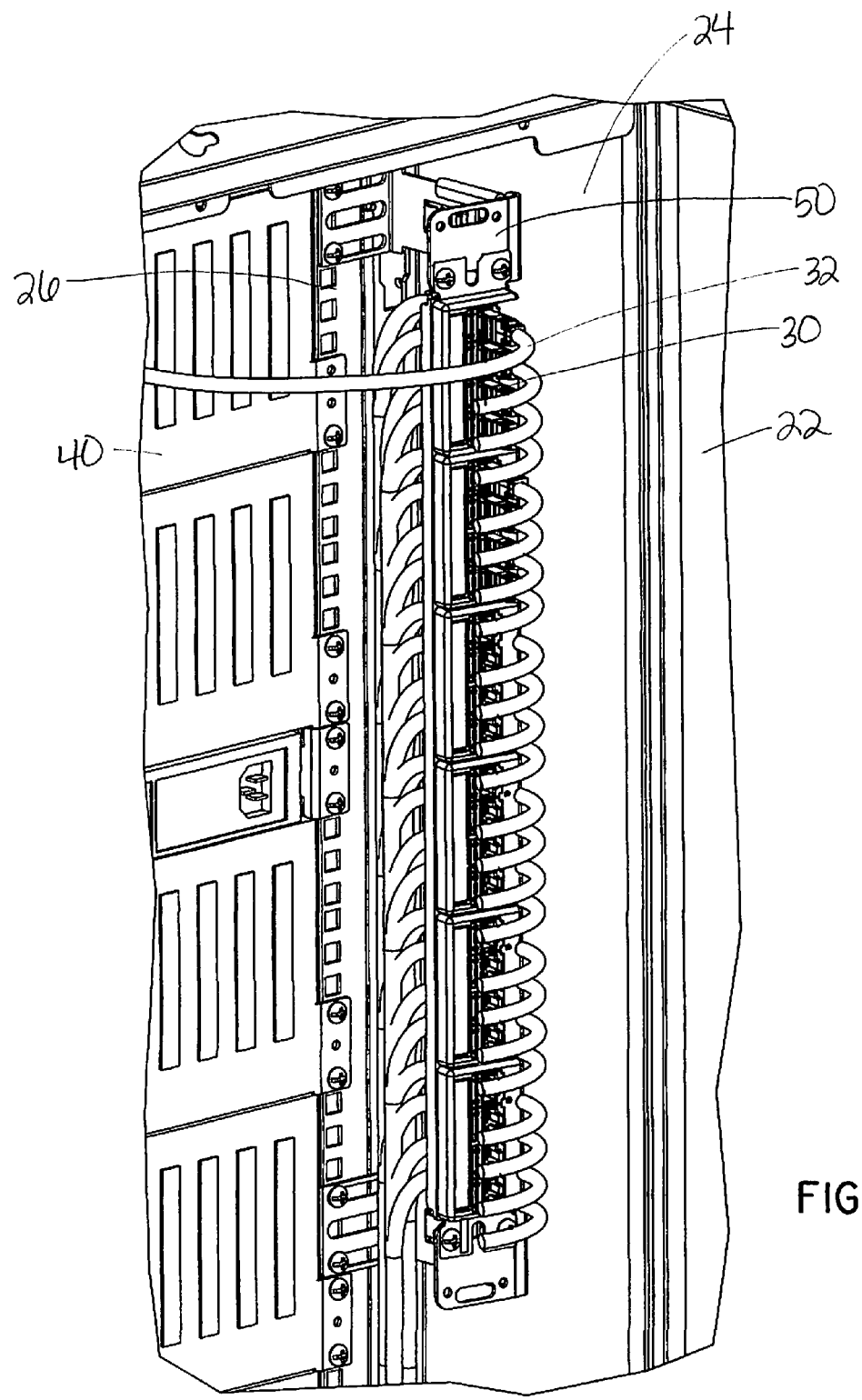
FIG. 2 is a front perspective view of the vertical patch panel mounted to the expandable patch panel bracket of FIG. 1.

FIGS. 1 and 2 illustrate a data center server cabinet 20 with a patch panel 30 vertically mounted to the expandable patch panel bracket 50 of the present invention. The patch panel bracket 50 is mounted to the rear rail 26 of the server cabinet 20. Various components 40 are also mounted to the rear rail 26. The vertically mounted patch panel 50 increases the amount of usable rack space within the server cabinet 20. As a result, the network patching functions are located along the sidewall of the cabinet instead of occupying valuable rack unit space between the cabinet rails.

Figure 3:
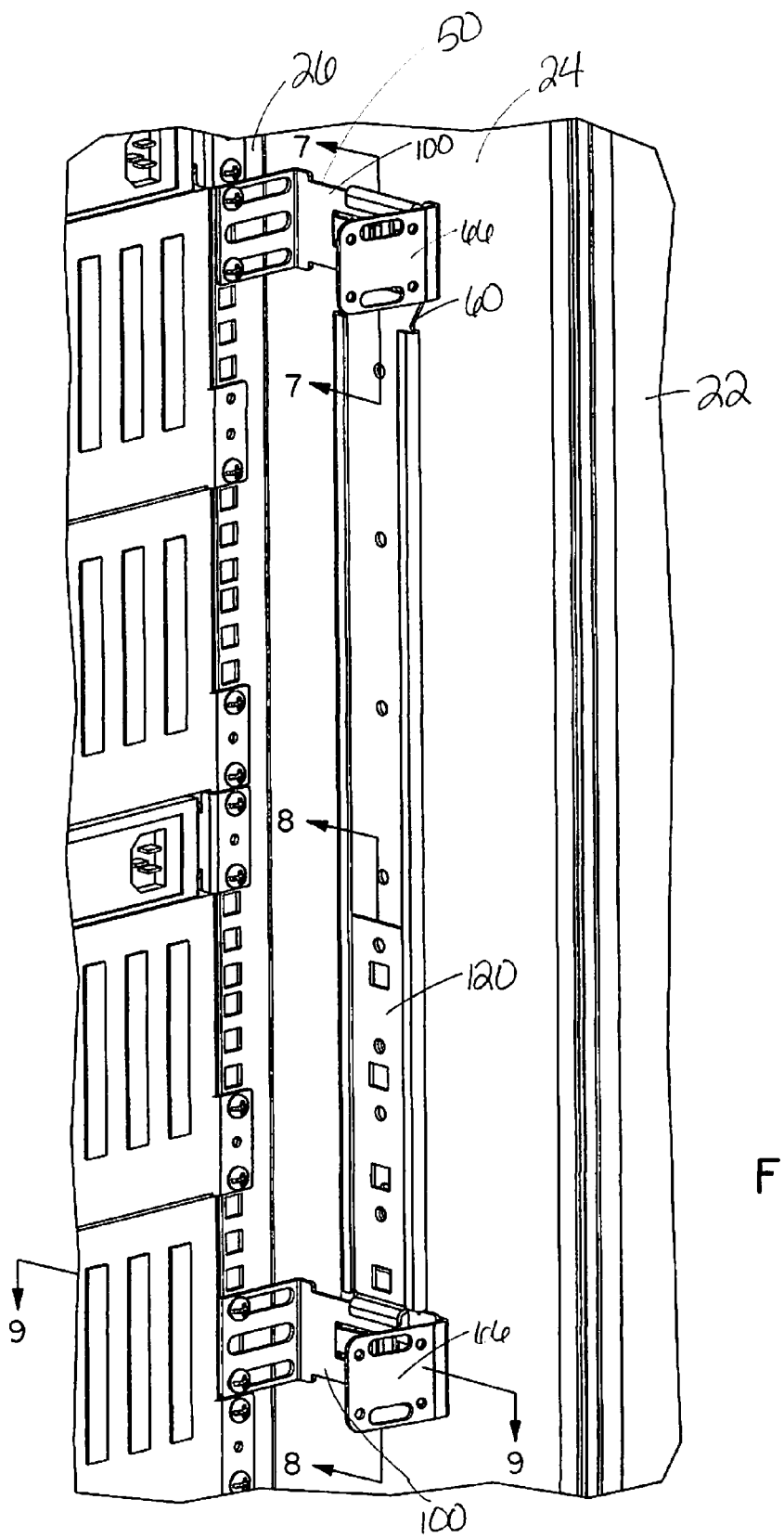
FIG. 3 is a front perspective view of the expandable patch panel bracket of FIG. 1 mounted to the rear rails of the cabinet.
Figure 4:
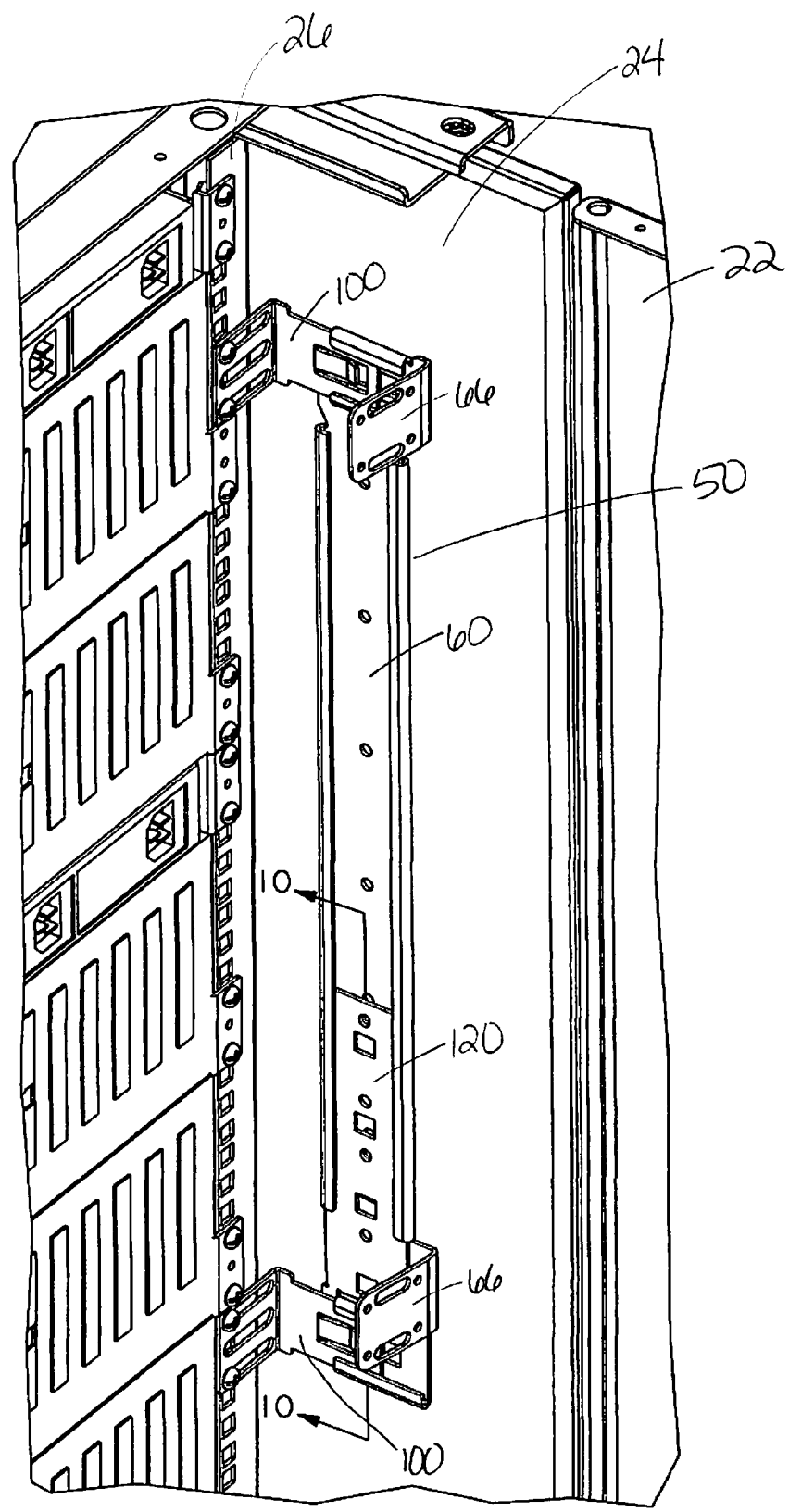
FIG. 4 is a front perspective view of the patch panel bracket of FIG. 3 expanded horizontally and vertically.

FIGS. 3 and 4 illustrate the expandable patch panel bracket 50 secured to the rear rail 26 of the cabinet 20. Since server cabinets in data centers vary in dimension, the expandable patch panel bracket 50 allows the installer to adjust the patch panel bracket 50 to optimize the mounting position of the patch panel 30 with respect to the side panels 24 and the rear doors 22 of the cabinet 20 (see FIGS. 1 and 2). Additionally, various components are typically installed onto the rail assemblies or fixed brackets mounted to the rear rails of a cabinet. As discussed below, the expandable patch panel bracket 50 of the present invention also enables the installer to reposition the lower mount bracket 120 to avoid interference with other equipment mounted to the rails.

FIG. 3 illustrates the lower mount bracket 120 installed on the main bracket 60. When the lower mount bracket 120 is fully inserted, the length of the patch panel bracket 50 is 21 inches (12 rack units). The lower mount bracket may be adjusted to increase the length of the patch panel bracket in 1.75 inch increments to a maximum length to 26.25 inches (15 rack units). FIG. 4 illustrates the patch panel bracket 50 with the lower mount bracket 120 extended to a first position having a length of 22.75 inches.

Figure 5:
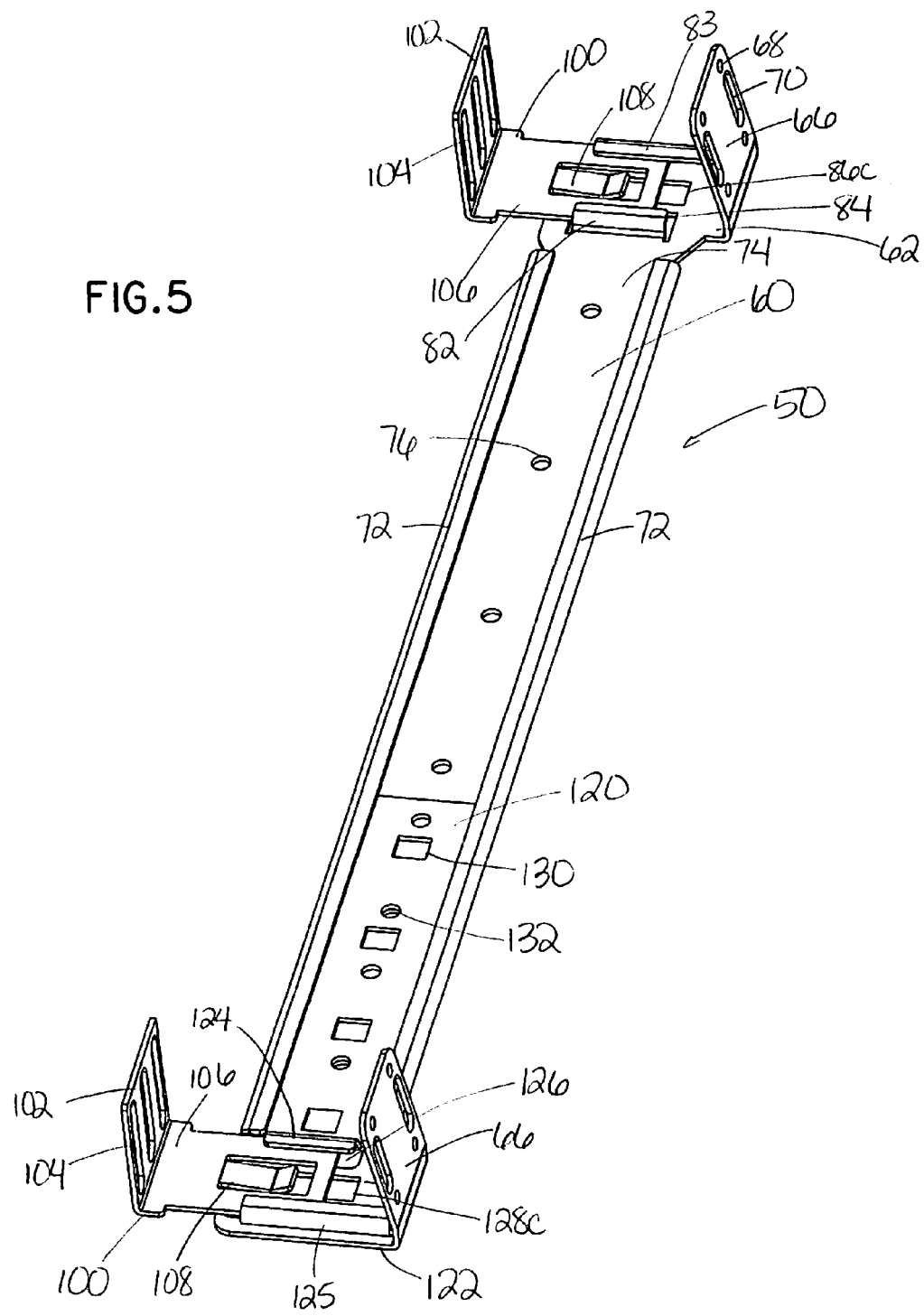
FIG. 5 is a perspective view of the expandable patch panel bracket of FIG. 3.
Figure 6:
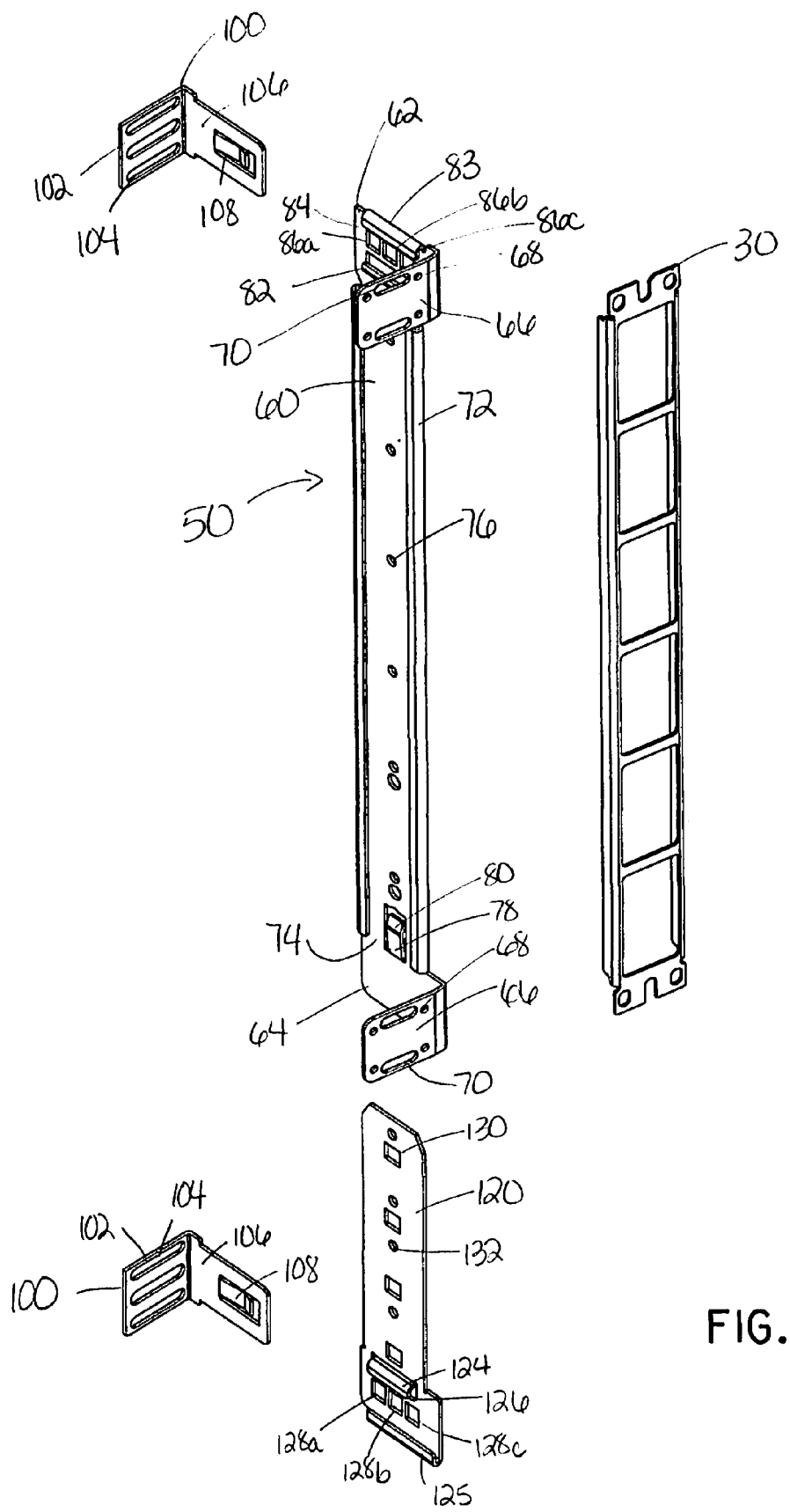
FIG. 6 is an exploded view of a patch panel and the expandable patch panel bracket of FIG. 3.

FIGS. 5 and 6 illustrate the expandable patch panel bracket 50 of the present invention. The patch panel bracket 50 includes a main bracket 60, two rail mount brackets 100 and a lower mount bracket 120. The main bracket 60 includes an upper end 62 and a lower end 64 with a front mounting side 66 at each end. The front mounting sides 66 are positioned at a slight acute angle to enhance cable management from the patch panel 30. The angled front mounting sides 66 also minimize the amount of space required between the patch panel 30 and the rear door 22 of the server cabinet 20. The front mounting sides 66 include tapped holes 68 and clearance slots 70 located between the holes 68. The tapped holes 68 enable a standard 19 inch flat patch panel 30 to be installed onto the patch panel bracket 50. The clearance slots 70 allow an installer to temporarily hold the screws used to secure the rail mount brackets 100 to the rear rails 26 of the server cabinet 20.

The main bracket 60 also includes curved flanges 72 that extend the length of the main bracket 60 to create a slotted channel 74 along the main bracket 60. A plurality of clearance holes 76 are located along the slotted channel 74. The clearance holes 76 are designed to receive cable tie mounts to retain network cables exiting the backside of the patch panel 30.

The lower end 64 of the main bracket 60 includes a raised locking latch 78. As discussed below, the raised locking latch 78 secures the lower mount bracket 120 to the main bracket 60. The raised locking latch 78 includes a tapered lead-in member 80 to allow the lower mount bracket 120 to slide past the raised locking latch 78 to the desired position.

The upper end 62 of the main bracket 60 includes a tab 82 and a roll over edge 83 that form a receiving channel 84. The upper end 62 also includes three square openings 86a, 86b, 86c positioned between the tab 82 and the roll over edge 83. As discussed below, the receiving channel 84 formed by the tab 82 and the roll over edge 83 is designed to receive a part of one of the rail mount brackets 100.

The rail mount brackets 100 are L-shaped. Each rail mount bracket 100 includes a backside 102 with a plurality of rail mounting slots 104 and a side member 106 with a raised locking latch 108 similar to the raised locking latch 78 on the main bracket 60. The mounting slots 104 receive a fastener, such as a screw, to enable the rail mount bracket 100 to be mounted to the rear rail 26 in a server cabinet 20.

The lower mount bracket 120 includes a lower end 122 with a tab 124 and a roll over edge 125 that form a receiving channel 126. The lower end 122 of the lower mount bracket 120 also includes three square openings 128a, 128b and 128c positioned between the tab 124 and the roll over edge 125. As discussed below, the receiving channel 126 formed by the tab 124 and the roll over edge 125 is designed to receive a part of one of the rail mount brackets 100.

The lower mount bracket 120 also includes square openings 130 that are located along the length of the lower mount bracket 120 for engaging the raised locking latch 78 of the main bracket 60. The lower mount bracket 120 further includes a plurality of clearance holes 132 for receiving cable tie mounts (if desired).

The lower mount bracket 120 is slid into the slotted channel 74 formed by the curved flanges 72 of the main bracket 60. The raised locking latch 78 is designed to engage one of the square openings 130 on the lower mount bracket 120 to secure the lower mount bracket 120 to the main bracket 60. The lower mount bracket 120 slides past the raised locking latch 78 to the desired position when a slightly higher insertion or pull force is exerted on the lower mounted bracket 120. Thus, the lower mount bracket 120 can be vertically adjusted to avoid interference with the server components 40 secured to the rail 26 when installing the patch panel bracket 50 on the rear rail 26.

As illustrated in FIG. 5, the side members 106 of the rail mount brackets 100 slide in the receiving channel 84 formed by the tab 82 and the roll over edge 83 at the upper end 62 of the main bracket 60 and the receiving channel 126 formed by the tab 124 and the roll over edge 125 at the lower end 122 of the lower mount bracket 120. The raised locking latch 108 in the side member 106 of each rail mount bracket 100 engages one of the square openings 86a, 86b, 86c or 126a, 126b, 126c to secure the rail mount brackets 100 to the main bracket 60 and the lower mount bracket 120, respectively. The square openings 86a, 86b, 86c or 126a, 126b, 126c allow the rail mount brackets 100 to be mounted in one of three fixed positions that are spaced apart by ½ inch increments. Thus, the position of the rail mount bracket 100 is horizontally adjustable depending on the desired mount location of the patch panel 30.

Figure 7:
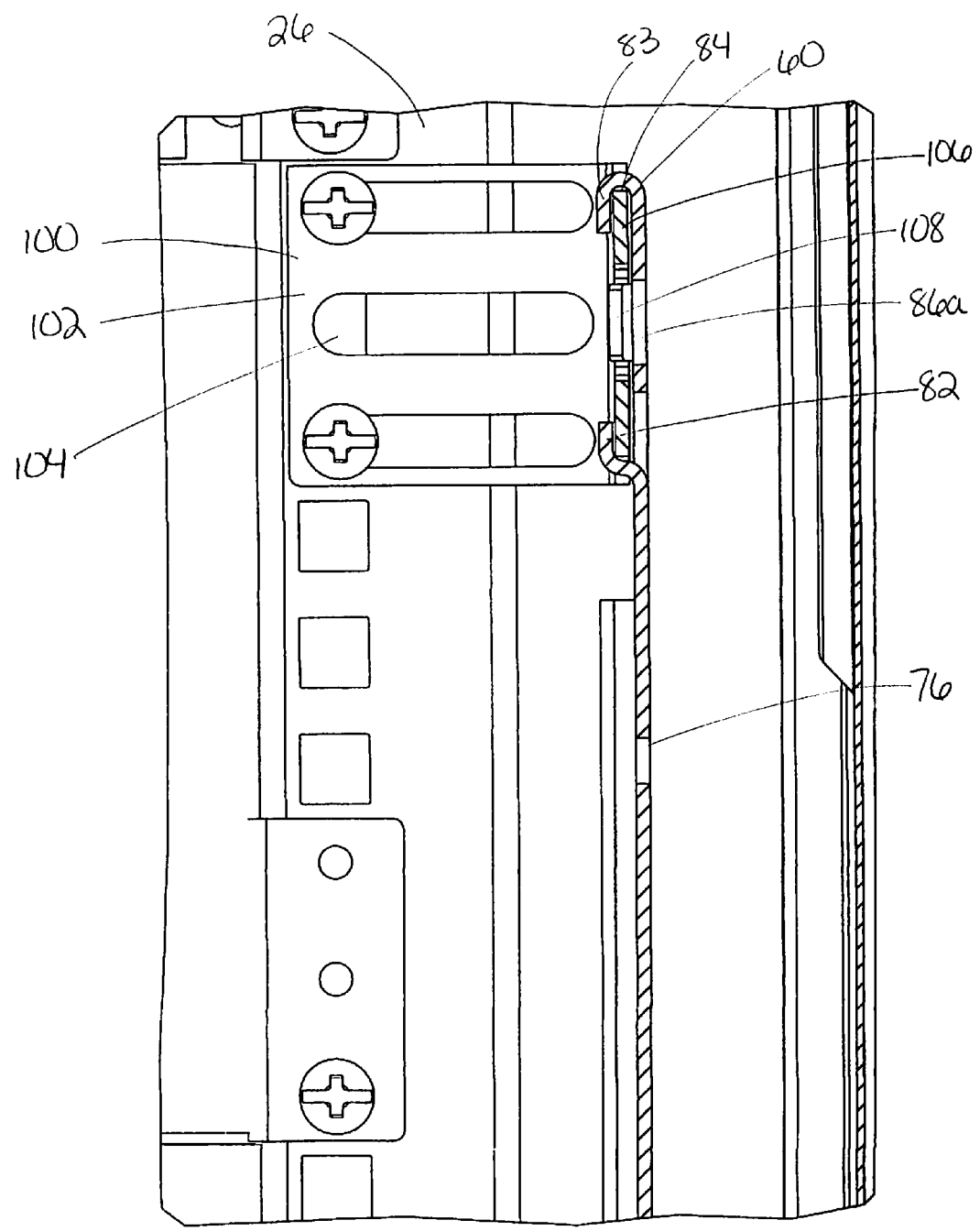
FIG. 7 is a cross sectional view of the expandable patch panel bracket of FIG. 3 taken along line 7-7.
Figure 8:
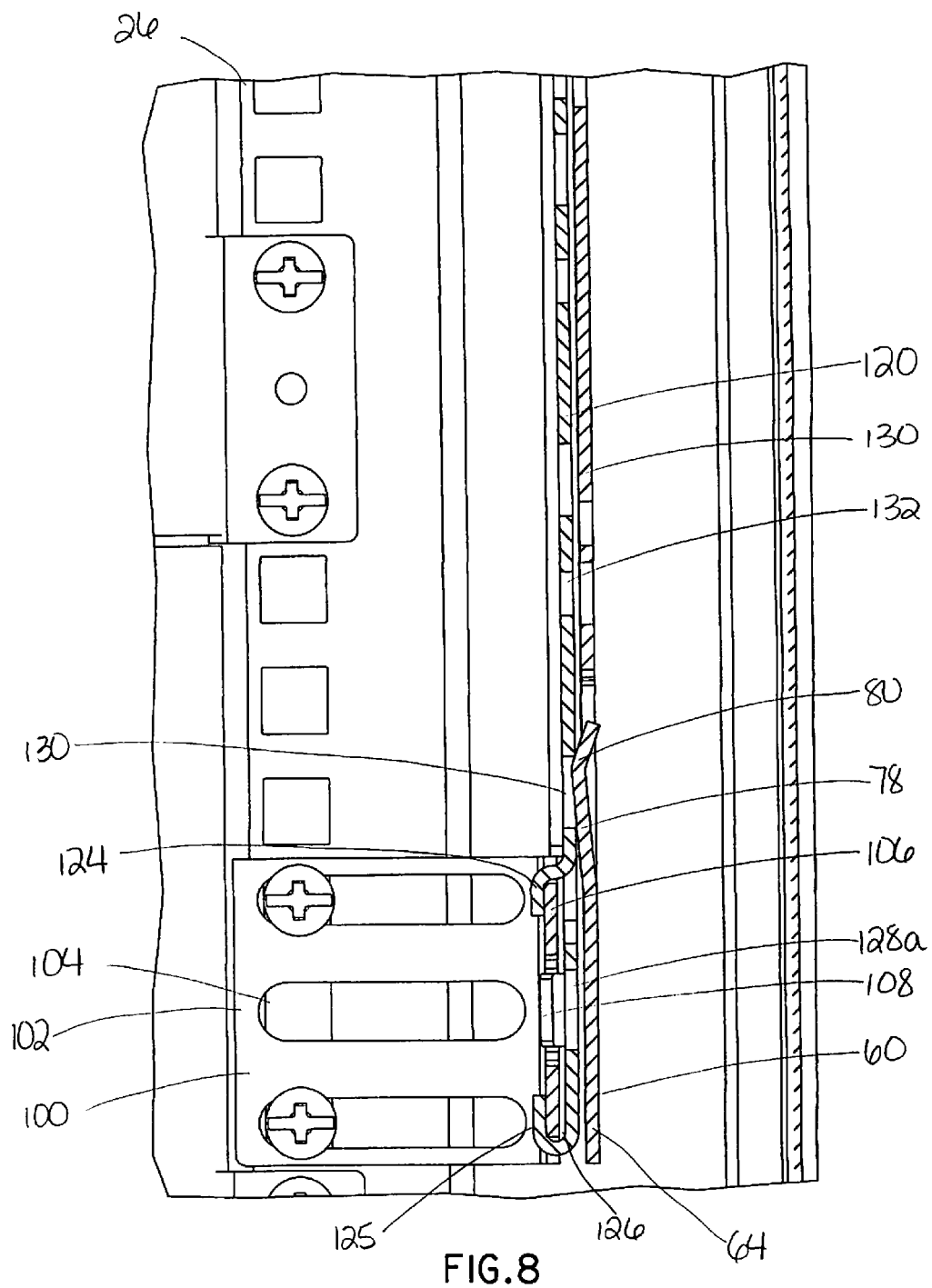
FIG. 8 is a cross sectional view of the expandable patch panel bracket of FIG. 3 taken along line 8-8.
Figure 9:
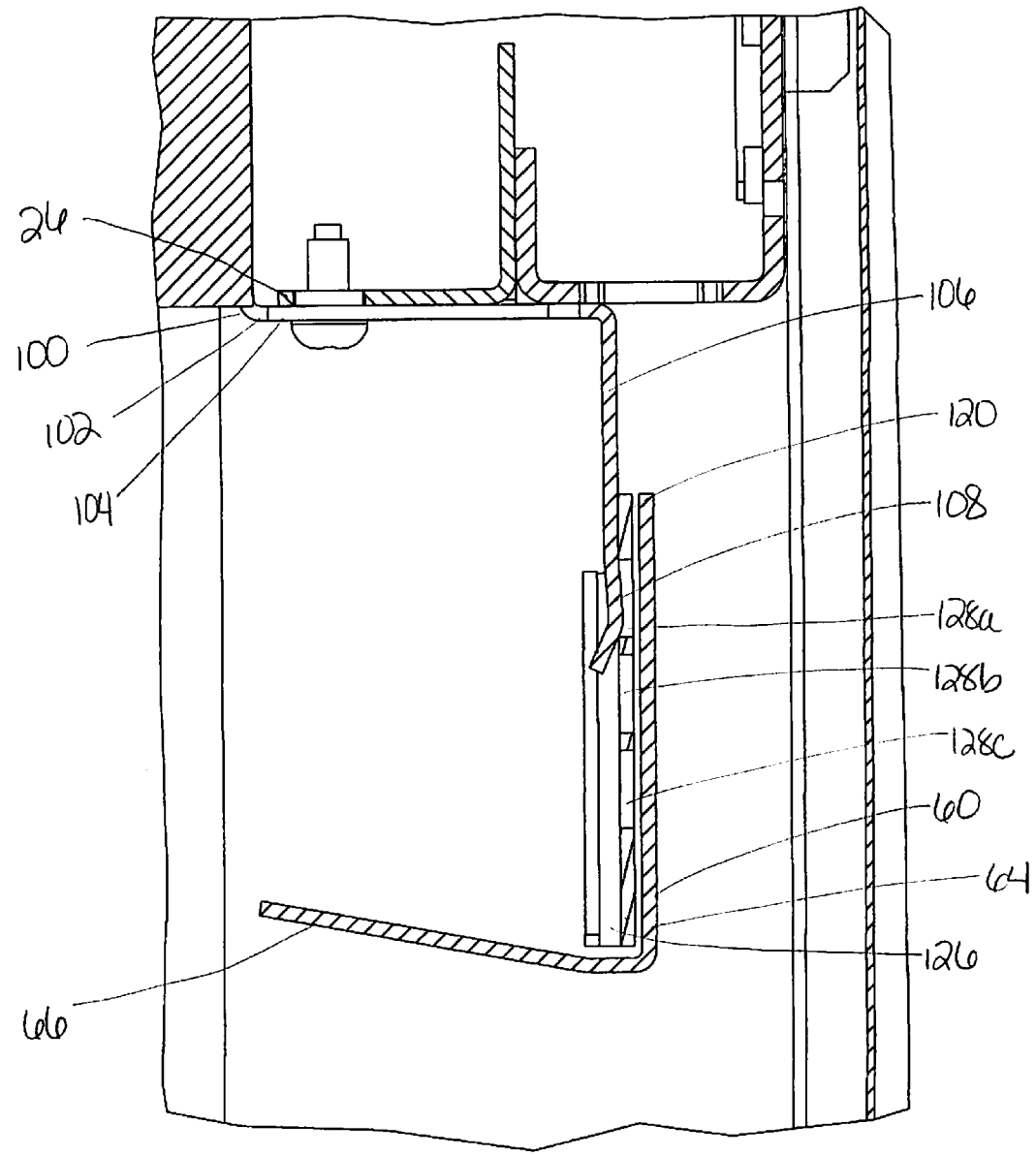
FIG. 9 is a cross sectional view of the expandable patch panel bracket of FIG. 3 taken along line 9-9.
Figure 10:
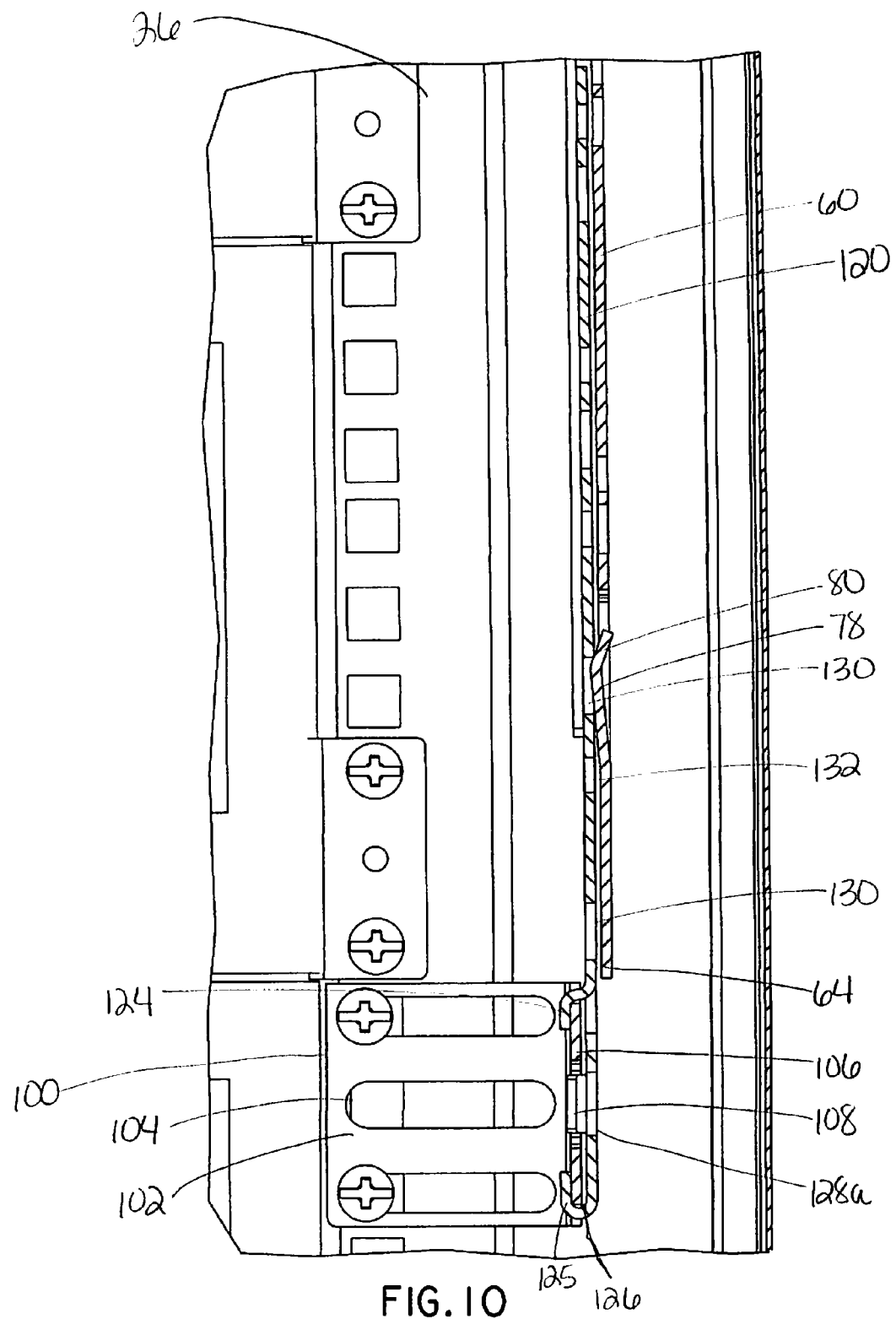
FIG. 10 is a cross sectional view of the expandable patch panel bracket of FIG. 4 taken along line 10-10.

FIG. 7 illustrates one of the rail mount brackets 100 secured to the rear rail 26 of the server cabinet 20 and the side member 106 of the rail mount bracket 100 secured to the upper end 62 of the main bracket 60. FIG. 8 illustrates one of the rail mount brackets 100 secured to the rear rail 26 and the side member 106 of the rail mount bracket 100 secured to the lower end 122 of the lower mount bracket 120. FIG. 8 also illustrates the raised locking latch 78 engaging one of the square openings 130 along the length of the lower mount bracket 120 thereby connecting the lower mount bracket 120 to the main bracket 60. FIG. 9 illustrates a front mounting side 66 of the main bracket 60 and the connection of the rail mount bracket 100 with the lower end 122 of the lower mount bracket 120. The raised locking latch 108 of the rail mount bracket 100 is positioned in the first square opening 128a to fully extend the patch panel bracket 50 in the horizontal direction as illustrated in FIG. 3. FIG. 10 illustrates the raised locking latch 78 of the main bracket 60 positioned in one of the square openings 130 of the lower mount bracket 120 to provide a vertically expanded bracket.

Figure 11:
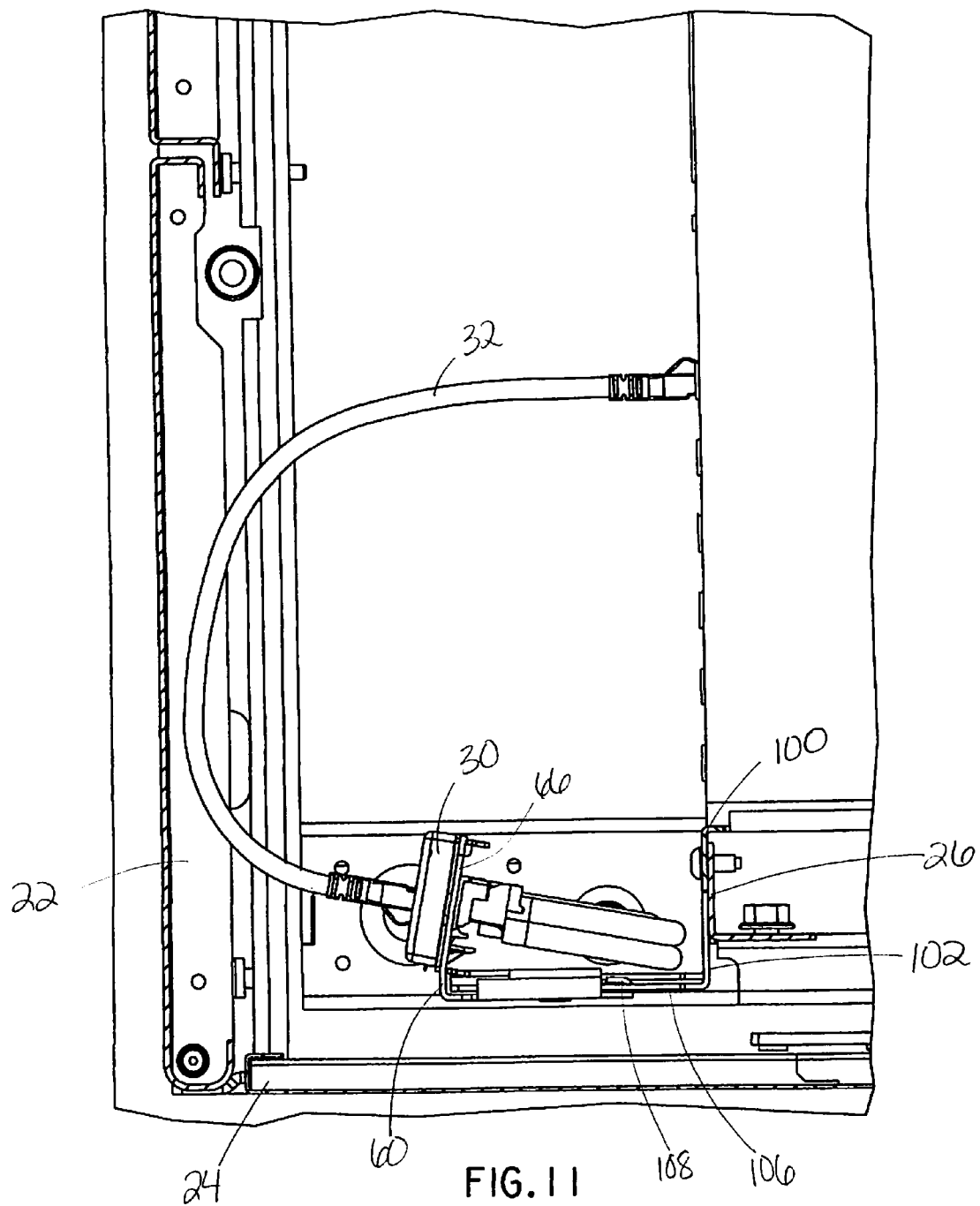
FIG. 11 is a top view of the patch panel vertically mounted to the patch panel bracket with the patch panel bracket fully extended in the horizontal direction.
Figure 12:
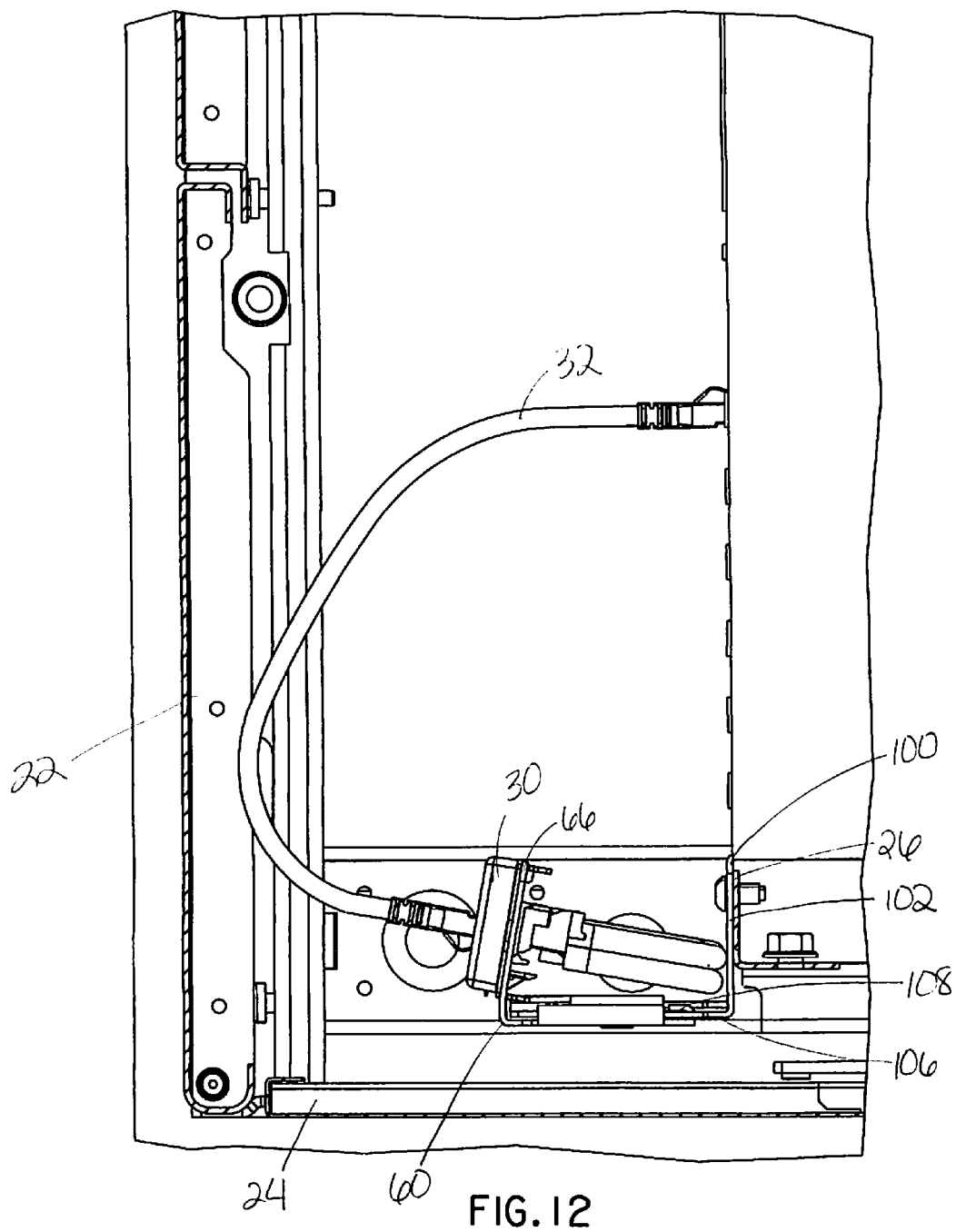
FIG. 12 is a top view of the vertically mounted patch panel of FIG. 11 with the patch panel bracket partially extended in the horizontal direction.
Figure 13:
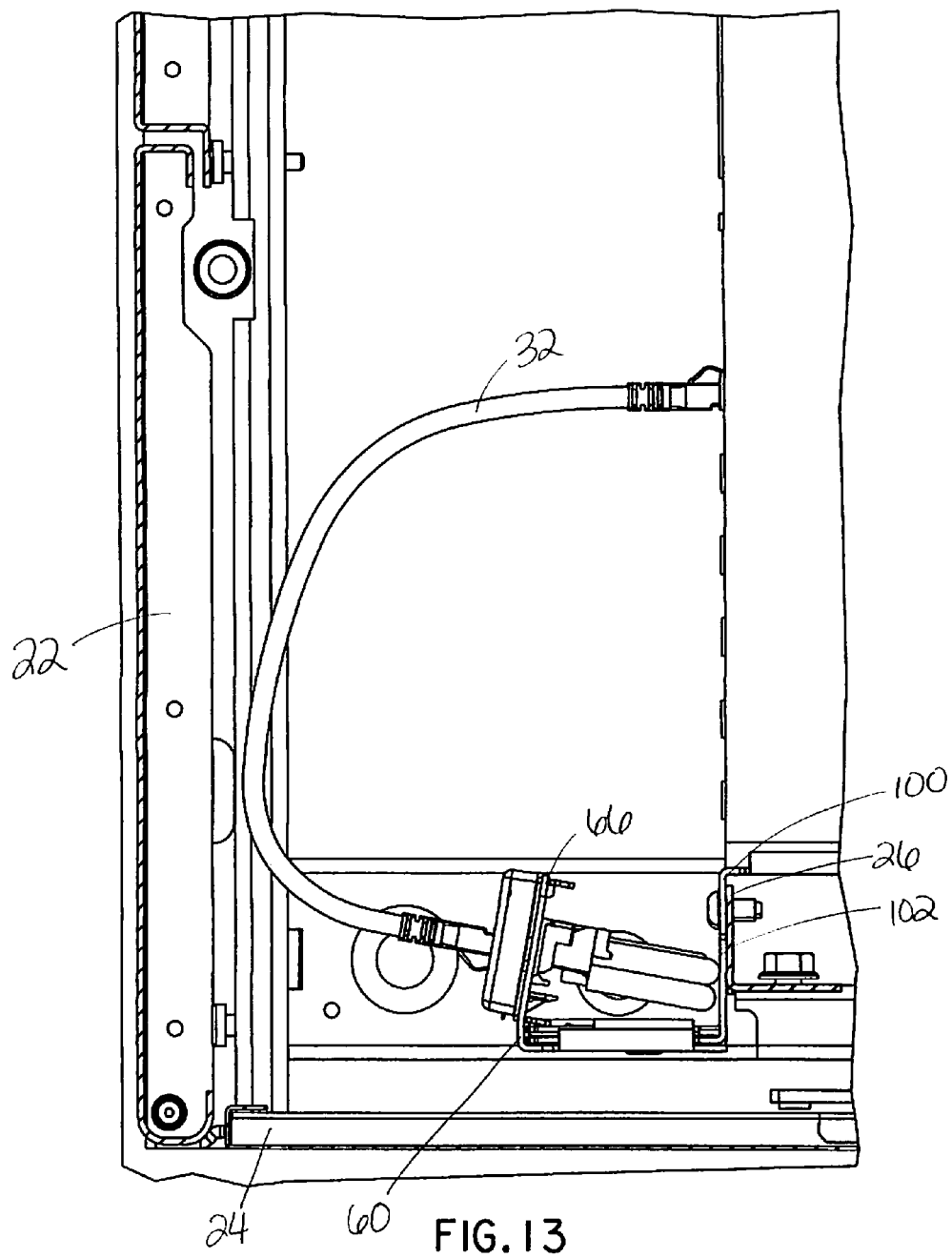
FIG. 13 is a top view of the vertically mounted patch panel of FIG. 11 with the patch panel bracket positioned close to the rear rail.

FIGS. 11-13 illustrate the patch panel bracket 50 with the rail mount brackets 100 adjusted to the various depth positions. FIG. 11 illustrates the patch panel bracket 50 fully extended such that the raised locking latches 108 of the rail mount brackets 100 are positioned in the first opening 86a of the main bracket 60 and the first opening 126a in the lower mount bracket 120. This fully extended position provides enough space behind the patch panel 30 to route network cables 32 between the patch panel bracket 50 and the rear rail 26 of the server cabinet 20. If there is sufficient space between the side wall and the rear rail 26 of the cabinet 20, the side member 106 of one of the rail mount brackets 100 may be positioned closer to the rear rail 26. FIG. 12 illustrates the patch panel bracket 50 partially extended such that the raised locking latches 108 of the rail mount brackets 100 are positioned in the second or middle square openings 86b, 126b of the main bracket 60 and the lower mount bracket 120, respectively. FIG. 13 illustrates the patch panel bracket 50 closer to the rear rail 26 with the raised locking latches 108 of the rail mount brackets 100 positioned in the third square openings 86c, 126c of the main bracket 60 and the lower mount bracket 120, respectively.

Figure 14:
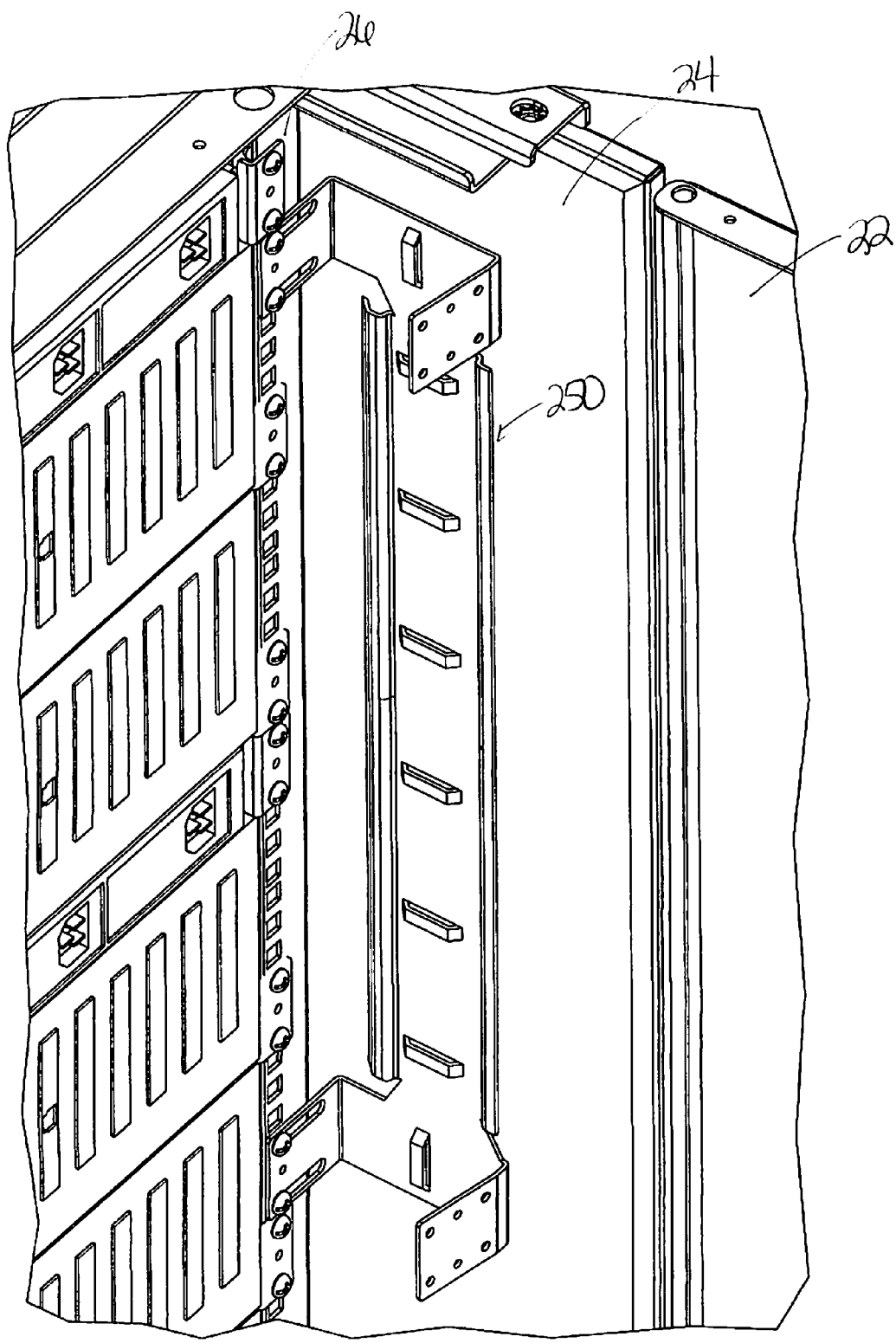
FIG. 14 is a front perspective view of an alternative patch panel bracket used to vertically mount a patch panel in a server cabinet.

FIG. 14 illustrates an alternative patch panel bracket 250 that enables an installer to vertically mount a patch panel 30 to the rear rails 26 in a cabinet 20. The patch panel bracket 250 enables a patch panel to be vertically mounted at a fixed length and width in the cabinet 22. Alternatively, a patch panel bracket may include only rail mount brackets or a lower mount bracket illustrated and described with respect to FIGS. 1-13 so that the patch panel bracket could be adjusted horizontally or vertically.

The expandable patch panel bracket of the present invention allows installers to optimize the mounting position of the vertically mounted patch panel with respect to the side panels and the rear doors of the server cabinet. Since the patch panel bracket may be adjusted, it is capable of vertically mounting patch panels to various server cabinets.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The actual scope of the invention is intended to be defined in the following claims when viewed in their proper perspective based on the prior art.

The invention claimed is:

1. A device for vertically mounting a patch panel, the device comprising:
   a main bracket having an upper end and a lower end;
   a lower mount bracket adjustably secured to the lower end of the main bracket, wherein the lower mount bracket includes a lower end; and
   rail mount brackets adjustably secured to the upper end of the main bracket and the lower end of the lower mount bracket.

2. The device of claim 1, wherein the main bracket includes curved flanges forming a slotted channel along the length of the main bracket.

3. The device of claim 2, wherein the lower mount bracket slides in the slotted channel of the main bracket.

4. The device of claim 1, wherein the lower end of the main bracket includes a latch for adjustably securing the lower mount bracket.

5. The device of claim 4, wherein the latch includes a tapered member.

6. The device of claim 4, wherein the lower mount bracket includes a plurality of openings along the length of the lower mount bracket, whereby the latch at the lower end of the main bracket engages one of the openings in the lower mount bracket.

7. The device of claim 1, wherein the main bracket includes angled front side members for receiving a patch panel.

8. The device of claim 1, wherein the upper end of the main bracket includes a tab and a roll over edge forming a receiving channel, whereby one of the rail mount brackets is positioned in the receiving channel.

9. The device of claim 1, wherein the upper end of the main bracket includes a plurality of openings.

10. The device of claim 9, wherein each rail mount bracket includes a back member and a side member, the back member includes a plurality of slots and the side member includes a latch, whereby the latch engages one of the openings at the upper end of the main bracket.

11. The device of claim 1, wherein the lower mount bracket includes a tab and a roll over edge forming a receiving channel, whereby one of the rail mount brackets is positioned in the receiving channel.

12. The device of claim 1, wherein the lower end of the lower mount bracket includes a plurality of openings.

13. The device of claim 12, wherein each rail mount bracket includes a back member and a side member, the back member includes a plurality of slots and the side member includes a latch, whereby the latch engages one of the openings at the lower end of the lower mount bracket.

14. A device for vertically mounting a patch panel in a cabinet, the device comprising:
   a main bracket having an upper end and a lower end;
   a lower mount bracket extending from the lower end of the main bracket; and
   rail mount brackets positioned at the upper end of the main bracket and the lower end of the lower mount bracket for securing the main bracket in the cabinet.

15. The device of claim 14, wherein one of the lower mount bracket and the rail mount brackets is adjustably secured to the main bracket.

16. The device of claim 15, wherein the lower mount bracket is adjustably secured to the main bracket for vertically expanding the main bracket.

17. The device of claim 15, wherein the rail mount brackets are adjustably secured to the main bracket and lower mount bracket for horizontally expanding the main bracket.

* * * * *